(12) United States Patent
Hsieh (10) Patent No.: US 8,314,000 B2
(45) Date of Patent: Nov. 20, 2012

(54) LDMOS WITH DOUBLE LDD AND TRENCHED DRAIN

(75) Inventor: Fu-Yuan Hsieh, Kaohsiung (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 13/006,556

(22) Filed: Jan. 14, 2011

(65) Prior Publication Data

US 2011/0165748 A1    Jul. 7, 2011

Related U.S. Application Data

(62) Division of application No. 12/382,708, filed on Mar. 23, 2009, now Pat. No. 7,898,026.

(51) Int. Cl.
*H01L 21/336* (2006.01)

(52) U.S. Cl. ............................ 438/286; 257/E21.409

(58) Field of Classification Search .................. 438/286, 438/296; 257/E21.409
See application file for complete search history.

(56) References Cited

U.S. PATENT DOCUMENTS

2004/0262680 A1    12/2004   Ehwald et al.
2008/0246086 A1*  10/2008   Korec et al. .................. 257/343

* cited by examiner

*Primary Examiner* — Matthew Reames
(74) *Attorney, Agent, or Firm* — Bacon & Thomas, PLLC (57) ABSTRACT

A LDMOS with double LDD and trenched drain is disclosed. According to some preferred embodiment of the present invention, the structure contains a double LDD region, including a high energy implantation to form lightly doped region and a low energy implantation thereon to provide a low resistance path for current flow without degrading breakdown voltage. At the same time, a P+ junction made by source mask is provided underneath source region to avoid latch-up effect from happening.

17 Claims, 12 Drawing Sheets

Fig. 9D

LDMOS WITH DOUBLE LDD AND TRENCHED DRAIN

This application is a divisional of and claims the benefit of the earlier filing date of co-pending U.S. patent application Ser. No. 12/382,708 filed on Mar. 23, 2009, the entire disclosure of co-pending application Ser. No. 12/382,708 is herein incorporated by reference.

BACKGROUND OF THE INVENTION

1. Field of the Invention

This invention relates generally to the cell structure and fabrication process of power semiconductor devices. More particularly, this invention relates to a novel and improved cell structure and improved process for fabricating a LDMOS (Laterally Diffused MOS transistors) with double LDD (Lightly Doped Drain) and trenched drain structure to provide a low resistance path for the current with enhanced FOM characteristic.

2. The Prior Arts

Figure 1:
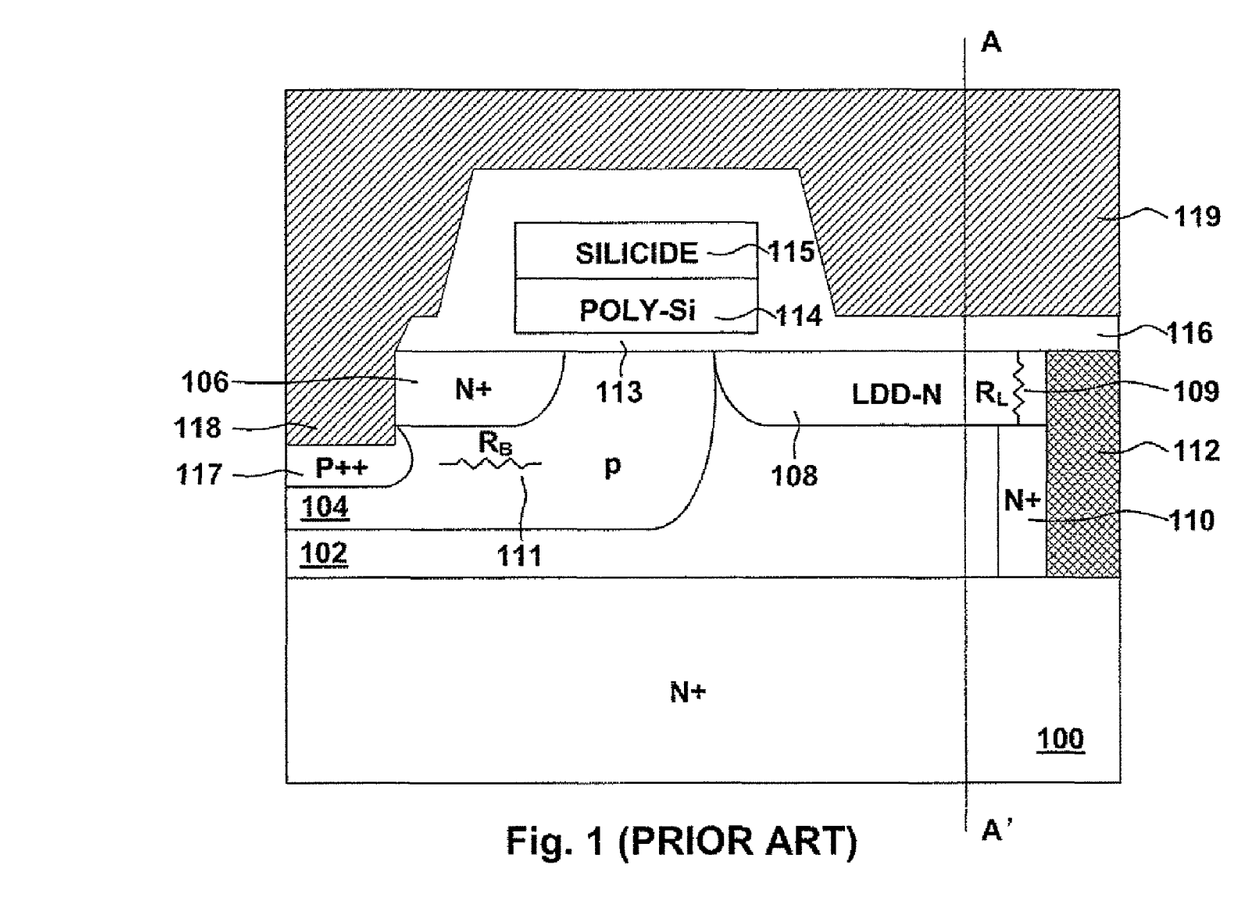
FIG. 1 is a side cross-sectional view of a LDMOS cell of prior art.

In U.S. Pat. No. 7,282,765, a LDMOS transistor cell with substrate having a first N semiconductor doping type of prior art was disclosed, as shown in FIG. 1. The transistor cell structure comprises: a highly N+ doped substrate 100 onto which formed a lightly doped epitaxial layer 102 having dopants of N or P dopant type; a body region 104 having P type dopants within which implanted an N+ source region 106; a LDD region 108 formed into epitaxial layer 102 while adjacent to the top surface of said epitaxial layer; a vertical drain contact region 110 where current flows through; a deep trench region 112 for the formation of vertical drain contact region 110 while its open; conductive gate including a doped polysilicon layer 114 and an upper silicide layer 115 formed over a gate dielectric 113; an insulating layer 116 covering the source region 106, the conductive gate sidewalls and its upper surface, and the LDD region 108. The illustrated structure further comprises a shallow trench region 118 by which body region 104 and source region 106 are connected to source metal 119, while a body contact doping region 117 having a dopant concentration P++ greater than the concentration of body region is introduced to reduce the resistance between body region and source metal.

As analyzed in prior art, the LDD region 108 increases the drain-to-source breakdown voltage (BV) of the LDMOS due to its lower doping concentration. However, the low concentration of drain region can not provide a low resistance path for current flow, that means the on resistance between drain and source (Rdson) is large due to low doping concentration in drain region, which will lead to a large conduction loss. Therefore, it is necessary to make a compromise between breakdown voltage and Rdson to optimize the device performance.

Another disadvantage of the prior art is that, there is a high parasitic resistance $R_L$ 109 between surface of the LDD region 108 and N+ region 110 connected to bottom of LDD region 108 due to the lower doping concentration, causing high Rdson between drain and source.

Another disadvantage of the prior is that, a parasitic bipolar N+PN in the prior art is easily triggered on due to existence of high base resistance $R_B$ 111 underneath source region 106, resulting in device destroy.

Accordingly, it would be desirable to provide a new LDMOS cell structure with low on-resistance between the source region and drain region while sustaining a high breakdown voltage without triggering on the parasitic bipolar.

SUMMARY OF THE INVENTION

It is therefore an object of the present invention to provide new and improved LDMOS cell and manufacture process to reduce the on resistance and increase breakdown voltage, while remaining a lower fabricating cost.

One aspect of the present invention is that, as shown in FIG. 2, and FIGS. 4 to 8, after the formation of the LDD-N1 region, another LDD implantation with a higher doping concentration and lower energy is carried out above said LDD-N1 region with the same mask to form an LDD-N2 region encompassed in the LDD-N1 region. At the same time, one side of both said LDD-N1 region and said LDD-N2 region contacts with a highly doped N+ region next to a drain contact trench, and another side of both the LDD-N1 and the LDD-N2 regions overlaps with doped polysilicon. By employing the double N LDD structure, the low energy implantation LDD-N2 region provides a low on-resistance path for the current flow, while the high energy implantation LDD-N1 forms a lightly doped region to sustain a high breakdown voltage. FIG. 3 shows a doping profile along A-A' cross section of FIG. 2 in comparison with the single LDD in the prior art, from which it can be seen that, the doping profile of the double LDD region along a direction vertical to said channel region has a non-Gaussian distribution with "double hump" shape, which is not disclosed in the prior art. The simulation result of Rdson when Vg=10V is shown in Table 1, its value is reduced to about 41% compared to the prior art in FIG. 1. Further, when considering the FOM (Figure of Merit) value which is defined by Rdson times Qg, it also can be seen from Table 1 that, the structure of the present invention is well optimized by reducing the FOM to 61% of the prior art, thus a successful compromise between high breakdown voltage and reduced on-resistance is achieved by employing the present invention.

TABLE 1

Simulated Parameters when Vgs = 10 V

| Device | BV (V) | Rdson (mohm · mm$^2$) | Qgd (nC/mm$^2$) | Qg (nC/mm$^2$) | FOM (Rdson*Qg) (mohm · nC) |
|---|---|---|---|---|---|
| Single LDD | 20 | 10 | 0.5 | 2.2 | 22 |
| Double LDD | 25 | 5.9 | 1.1 | 1.9 | 11.2 |

Another aspect of the present invention is that, as shown in FIG. 2, and FIGS. 3 to 8, before the source implantation, a step of P+ implantation for the formation of avalanche improved region is carried out with a concentration from 1E18 to 5E19 atoms/cm$^3$ to form a P+ area underneath source region for reducing the base resistance in the parasitic bipolar.

Figure 4:
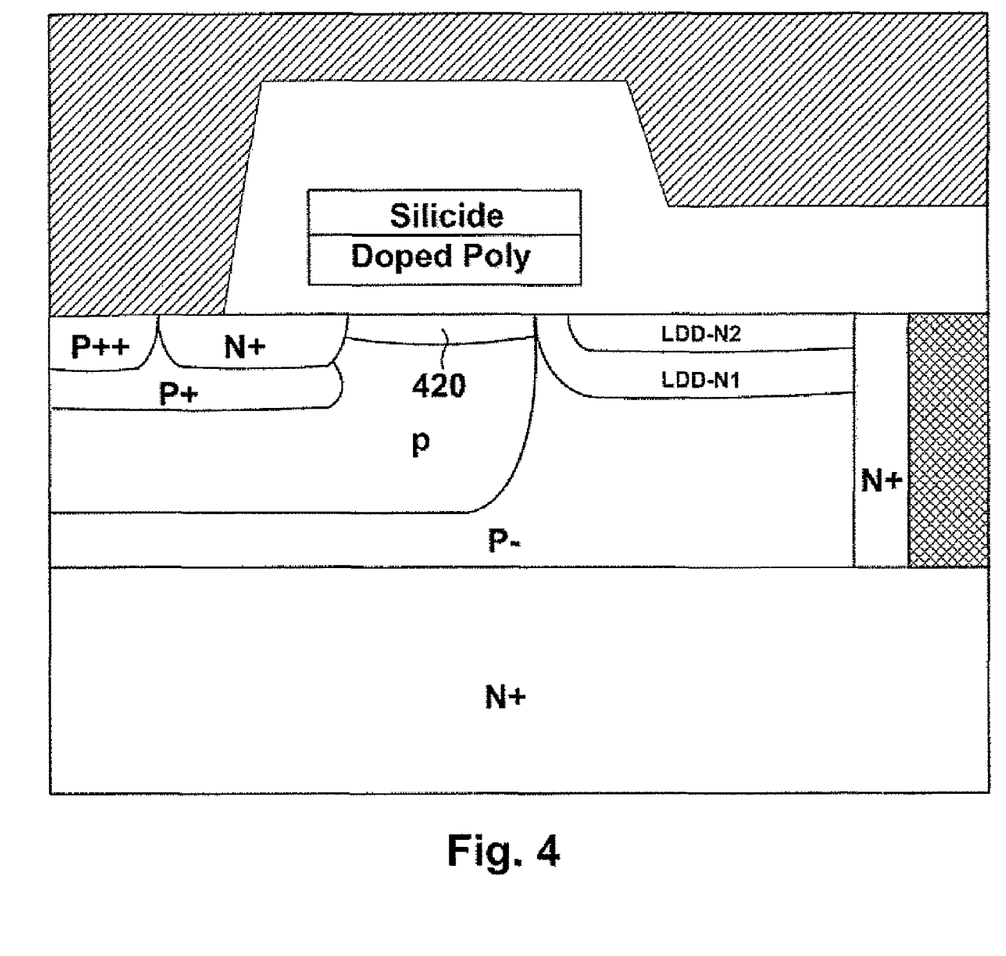
FIG. 4 is a side cross-sectional view of another preferred embodiment in accordance with the present invention.
Figure 6:
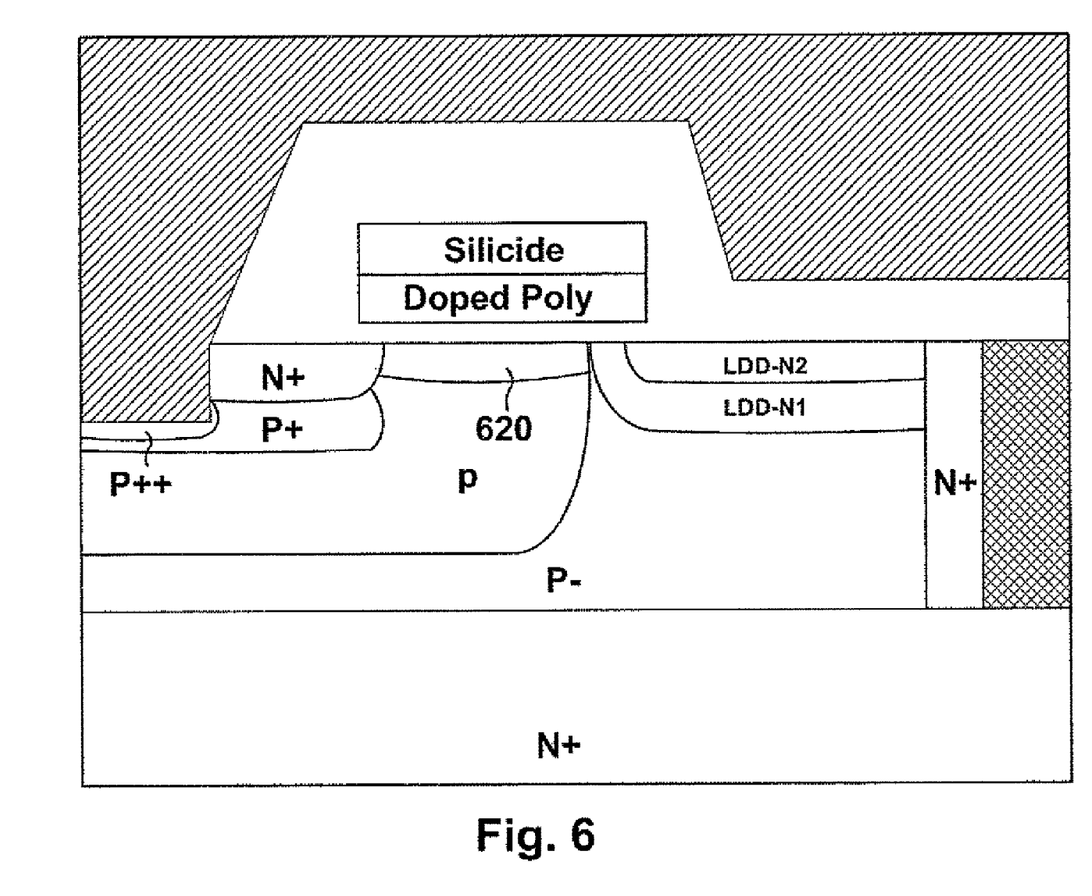
FIG. 6 is a side cross-sectional view of another preferred embodiment in accordance with the present invention.
Figure 8:
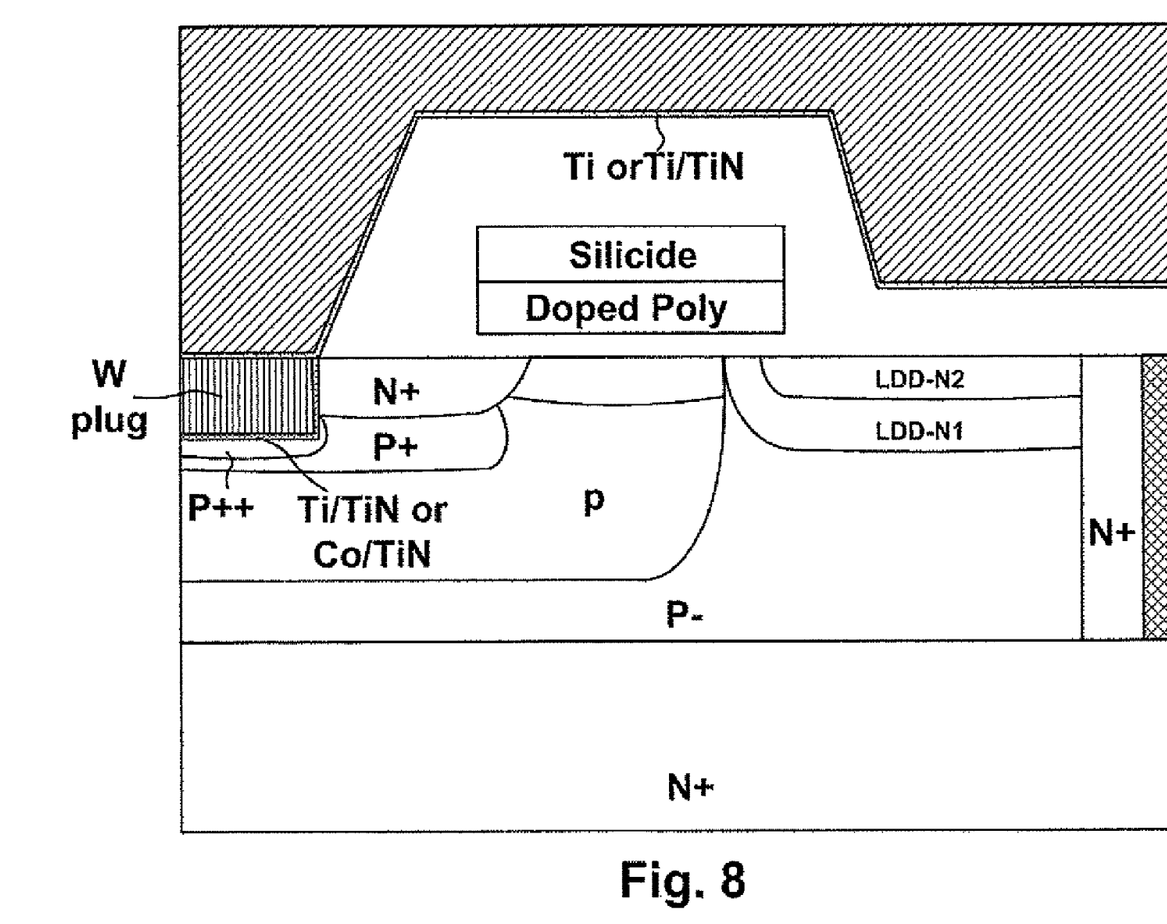
FIG. 8 is a side cross-sectional view of another preferred embodiment in accordance with the present invention.

Another aspect of the present invention is that, in some preferred embodiments, as shown in FIGS. 4, 6, and 8, Vth (threshold voltage) of the LDMOS is adjusted by Ion Implantation in channel region with dopant opposite to body region, e.g., N type dopant. The Rdson can be reduced further without having punch-through issue.

Figure 2:
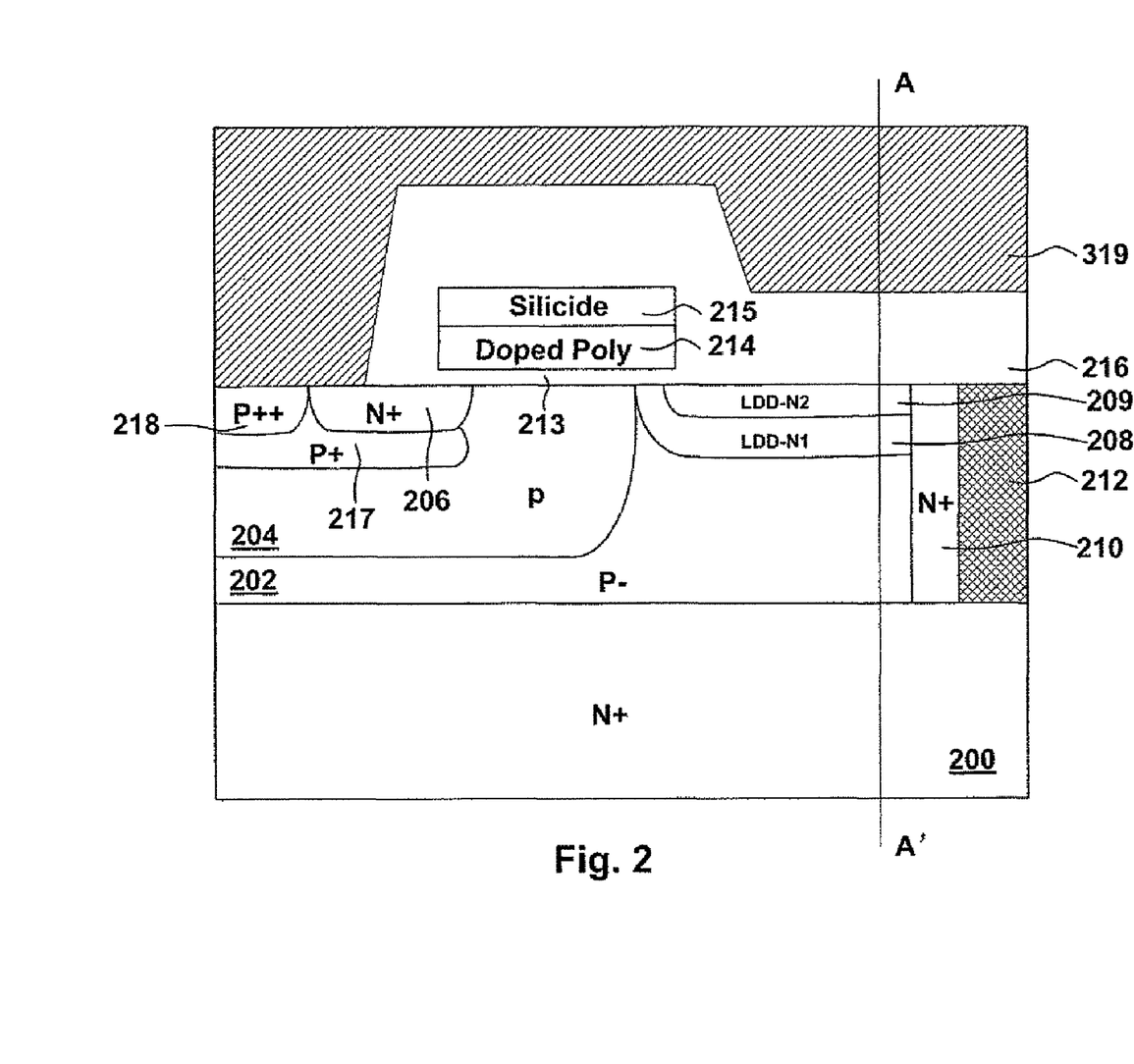
FIG. 2 is a side cross-sectional view of a preferred embodiment in accordance with the present invention.
Figure 3:
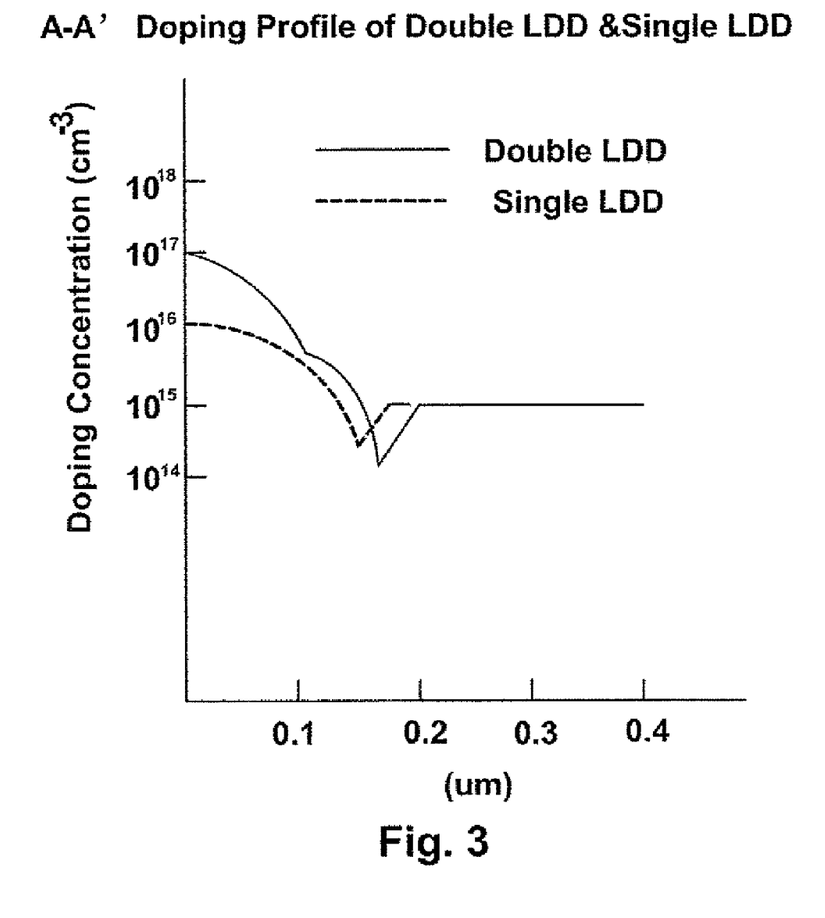
FIG. 3 is doping profile comparison between single LDD and double LDD.
Figure 5:
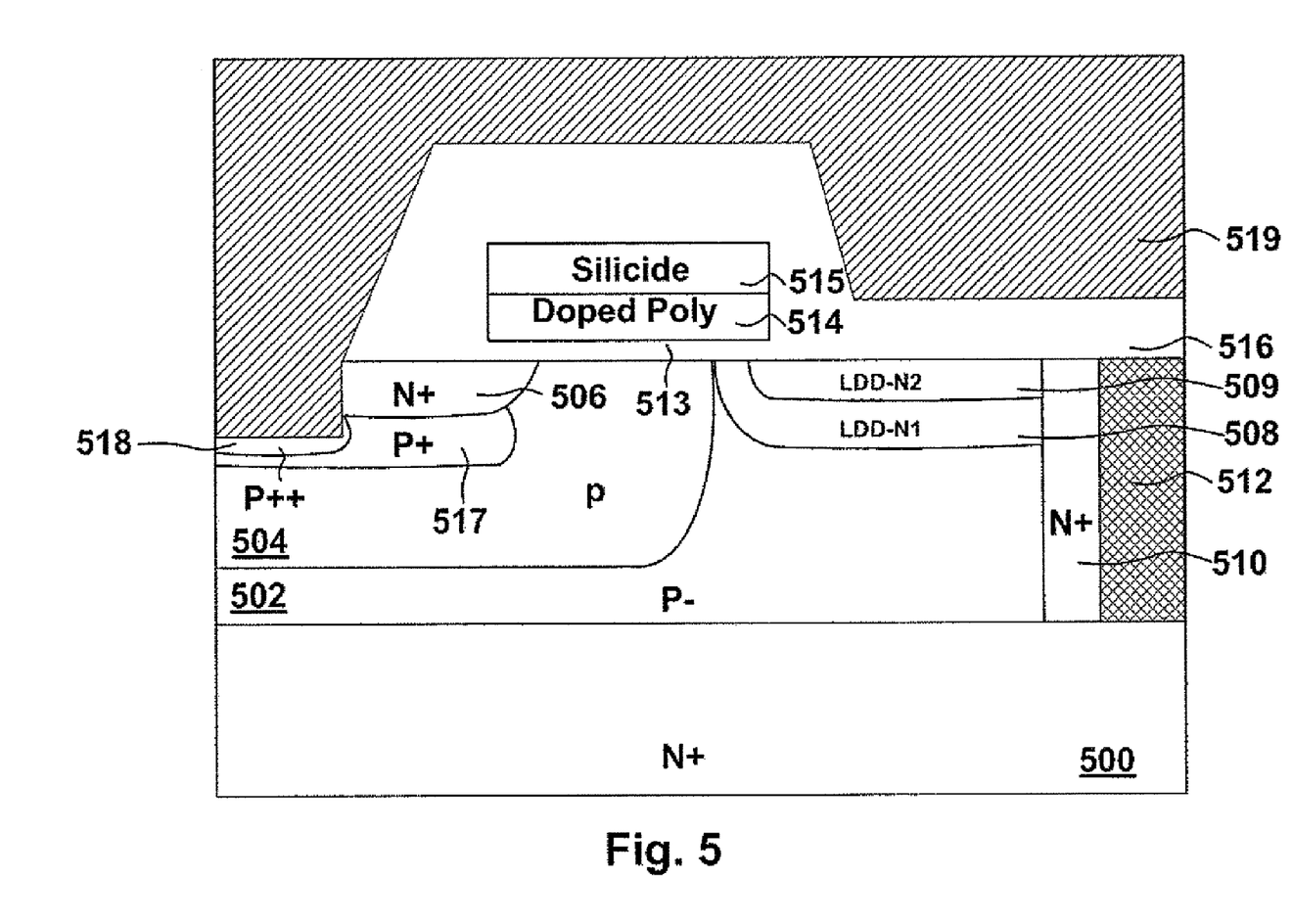
FIG. 5 is a side cross-sectional view of another preferred embodiment in accordance with the present invention.

Another aspect of the present invention is that, in some preferred embodiments, as shown in FIG. 5 and FIG. 6, in order to reduce contact dimension, trench source-body contact structure which is same as the prior art, is employed to take place of traditional planar contact as used in FIG. 2 and FIG. 4.

Figure 7:
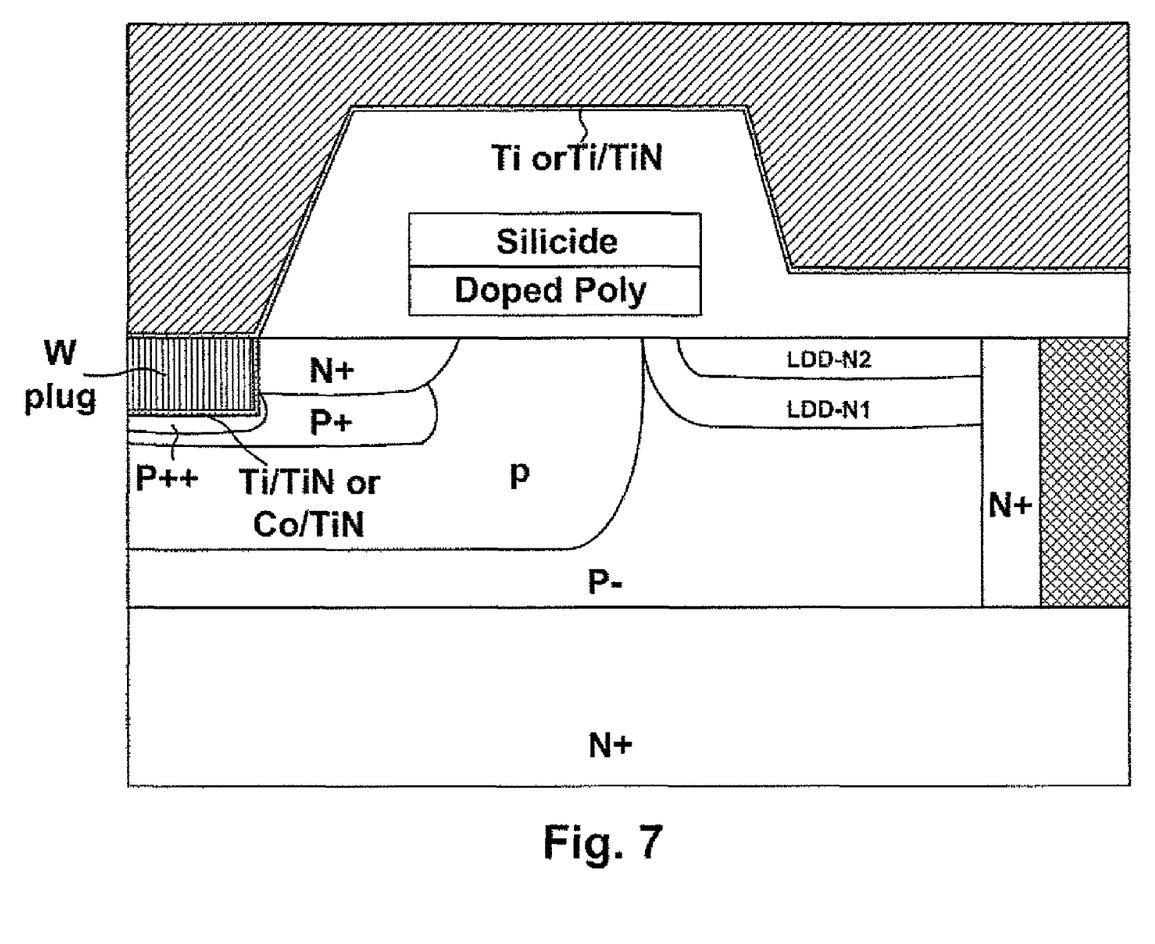
FIG. 7 is a side cross-sectional view of another preferred embodiment in accordance with the present invention.

Another aspect of the present invention is that, as shown in FIG. 7 and FIG. 8, the contact CD can be further shrunk with filling tungsten plug into the source-body contact trench and metal step coverage is also thus significantly improved.

Another aspect of the present invention is that, as no additional mask is required to implement the LDD-N2 region and the P+ area as mentioned above during fabrication, the device has better performance of high BV and low Rdson than the prior art without extra fabrication cost.

Briefly, in a preferred embodiment, as shown in FIG. 2, the present invention discloses an LDMOS cell comprising: an N+ substrate with a resistivity of less than 3 mohm-cm onto which a lightly doped P– epitaxial layer is grown; a P body region formed inside the P– epitaxial layer near the upper surface, within which an N+ source region is formed above a P+ avalanche improved region; an LDD-N1 region implanted within the P– epitaxial layer adjacent to the P body region and separated from the N+ source region by channel region; an LDD-N2 region implanted near the top surface of the LDD-N1 region to further reduce the path resistance for current flow; a conductive gate formed onto a first insulating layer over the channel region and partially covers the N+ source region, said LDD-N1 region and the LDD-N2 region with a layer of silicide thereon; a first trench serving as a drain contact trench opened through the LDD-N2 region, the LDD-N1 region and the P– epitaxial layer and extending into the N+ substrate to enable the formation of a drain contact region and filled with doped poly or Ti/TiN/W or Co/TiN/W plug; an N+ highly doped region surrounding sidewall of the drain contact trench and connecting the LDD-N1 region and the LDD-N2 region; a second insulating layer covering the N+ source region, the conductive gate sidewalls and its upper surface, the LDD-N1 region and the LDD-N2 region; a P++ body contact doping region next to the N+ source region near the top surface of the P body region above the P+ avalanche improved region to provide a low resistance contact between source metal and the P body region; the source metal formed over the second insulating layer to contact the N+ source region and the P++ body contact doping region laterally.

Briefly, in another preferred embodiment, as shown in FIG. 4, the present invention disclosed a similar LDMOS cell to structure in FIG. 2 except that, the channel region of cell structure in FIG. 4 was Ion Implanted with dopant of opposite doping type to body region to adjusted Vth to a lower value for Rdson reduction.

Briefly, in another preferred embodiment, as shown in FIG. 5, the present invention discloses a similar LDMOS cell to the structure shown in FIG. 2 except that a second trench serving as a source-body contact trench is etched through the second insulating layer and the N+ source region and extends into the P+ avalanche improved region or through the P+ avalanche improved region to the P body region (not shown). Accordingly, the P++ body contact doping region area is formed around the bottom of the second trench to provide a low resistance contact between the body region and the source metal filled into said second trench.

Briefly, in another preferred embodiment, as shown in FIG. 6, the present invention disclosed a similar LDMOS cell to structure in FIG. 5 except that, the channel region of cell structure in FIG. 6 was Ion Implanted with dopant of opposite doping type to body region to adjusted Vth to a lower value for Rdson reduction.

Briefly, in another preferred embodiment, as shown in FIGS. 7 and 8, the present invention discloses a similar LDMOS cell to the structures shown in FIGS. 5 and 6, respectively. The devices further comprise a source-body contact trench padded with a barrier layer composed of Ti/TiN or Co/TiN and filled with tungsten plug to contact the P body region and the N+ source region. The source-body contact trench is further extended into the P body region and has a P++ body contact doping region implanted surrounding at least its bottom to reduce the contact resistance. The top surface of the second insulation layer is covered with a metal resistance-reduction interlayer composed of Ti or Ti/TiN for reducing contact resistance between the tungsten plug and the source metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Please refer to FIG. 2 for a preferred embodiment of the present invention. The shown LDMOS cell is formed on an N+ substrate 200 onto which is grown a P– epitaxial layer 202 wherein a P body region 204 is implanted. An N+ source region 206 is formed near the top surface of the P body region 204 with a P+ avalanche improved region 217 underneath using the same source mask. Adjacent to a LDD-N1 region 208 and a LDD-N2 region 209 which is implanted successively near the top surface of the P– epitaxial layer, a first trench is etched through the P– epitaxial layer and filled with doped poly or Ti/TiN/W or Co/TiN/W as drain contact metal plug 212. An N+ highly doped region 210 is formed next to said drain contact and connected to both the LDD-N1 region and the LDD-N2 region to provide a tow resistance path for current flow. Above a first insulating layer, which serves as a gate oxide layer 213, a conductive gate 214 is formed over a channel region with a layer of silicide 215 thereon, partially overlaps the N+ source region 206, the LDD-N1 region 208 and the LDD-N2 region 209. Source metal 219 is deposited on a second insulating layer 216 and contacts with the N+ source region 206 and the P body region 204 laterally through a P++ body contact doping region 218 which reduces the resistance between the P body region and the source metal.

What should be noticed is that the LDD-N2 region is encompassed in the LDD-N1 region and has the doping profile as shown in FIG. 3, which illustrates a non-Gaussian distribution having a "double hump" shape.

FIG. 4 shows another preferred embodiment of the present invention. Comparing to FIG. 2, the channel region 420 of the structure in FIG. 4 is Ion Implanted with dopant of opposite doping type to body region to reduce the threshold voltage.

FIG. 5 shows another preferred embodiment of the present invention. Comparing to FIG. 2, the structure in FIG. 5 has a second trench etched through said second insulating layer 516, the N+ source region 506 and into the P+ avalanche improved region 517 to serve as a source-body contact trench. Around the bottom of said second trench, a P++ body contact doping region 518 is accordingly formed to reduce the resistance between the P body region 504 and the source metal 519.

FIG. 6 shows another preferred embodiment of the present invention. Comparing to FIG. 5, the channel region 620 of the structure in FIG. 6 is Ion Implanted with dopant of opposite doping type to body region to reduce the threshold voltage.

FIGS. 7 and 8 show another preferred embodiments of the present invention. Comparing to FIGS. 5 and 6, the source-body contact trench is filled with Tungsten plug padded with a barrier layer composed of Ti/TiN or Co/TiN. The top surface of the second insulation layer is covered with a metal resistance-reduction interlayer composed of Ti or Ti/TiN for reducing contact resistance between the tungsten plug and the source metal.

Figure 9A:
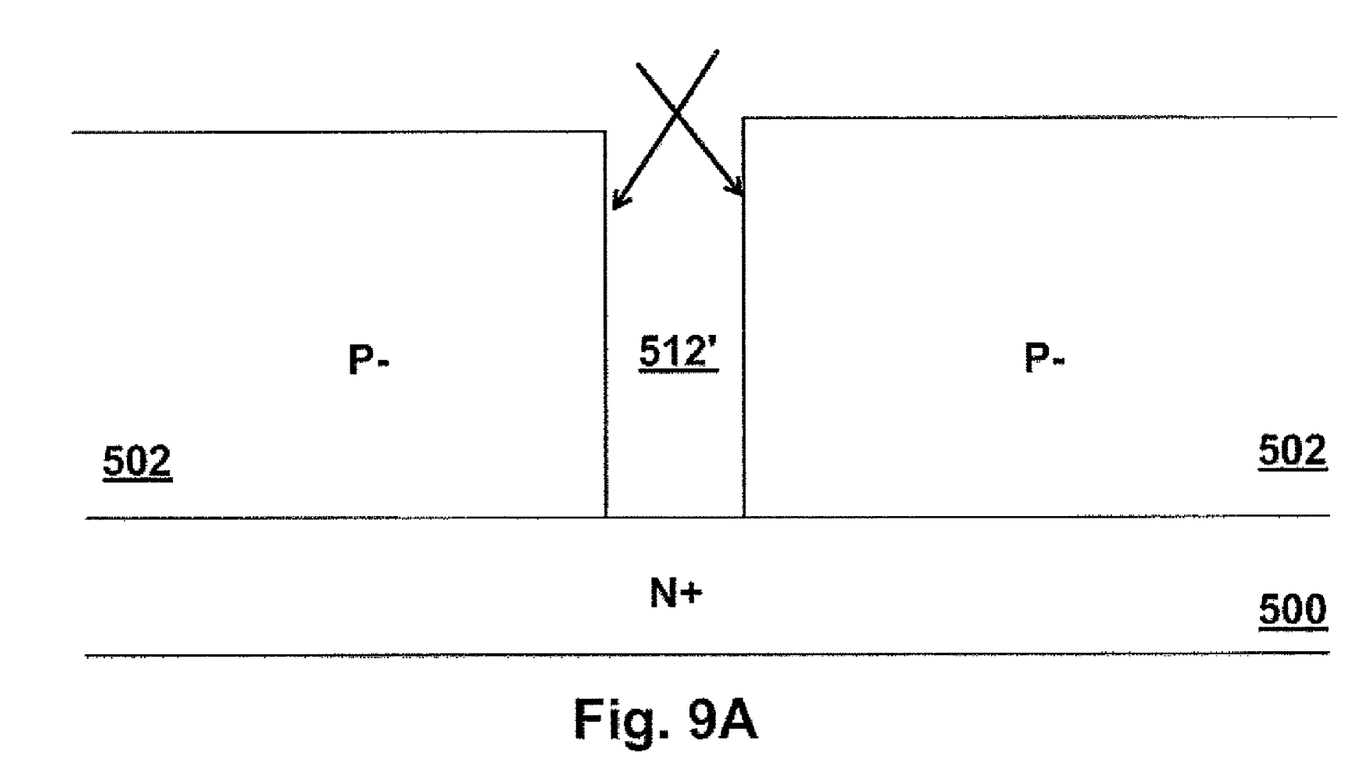
FIGS. 9A to 9D are a serial of side cross sectional views for showing the processing steps for fabricating LDMOS cell in FIG. 5.
Figure 9B:
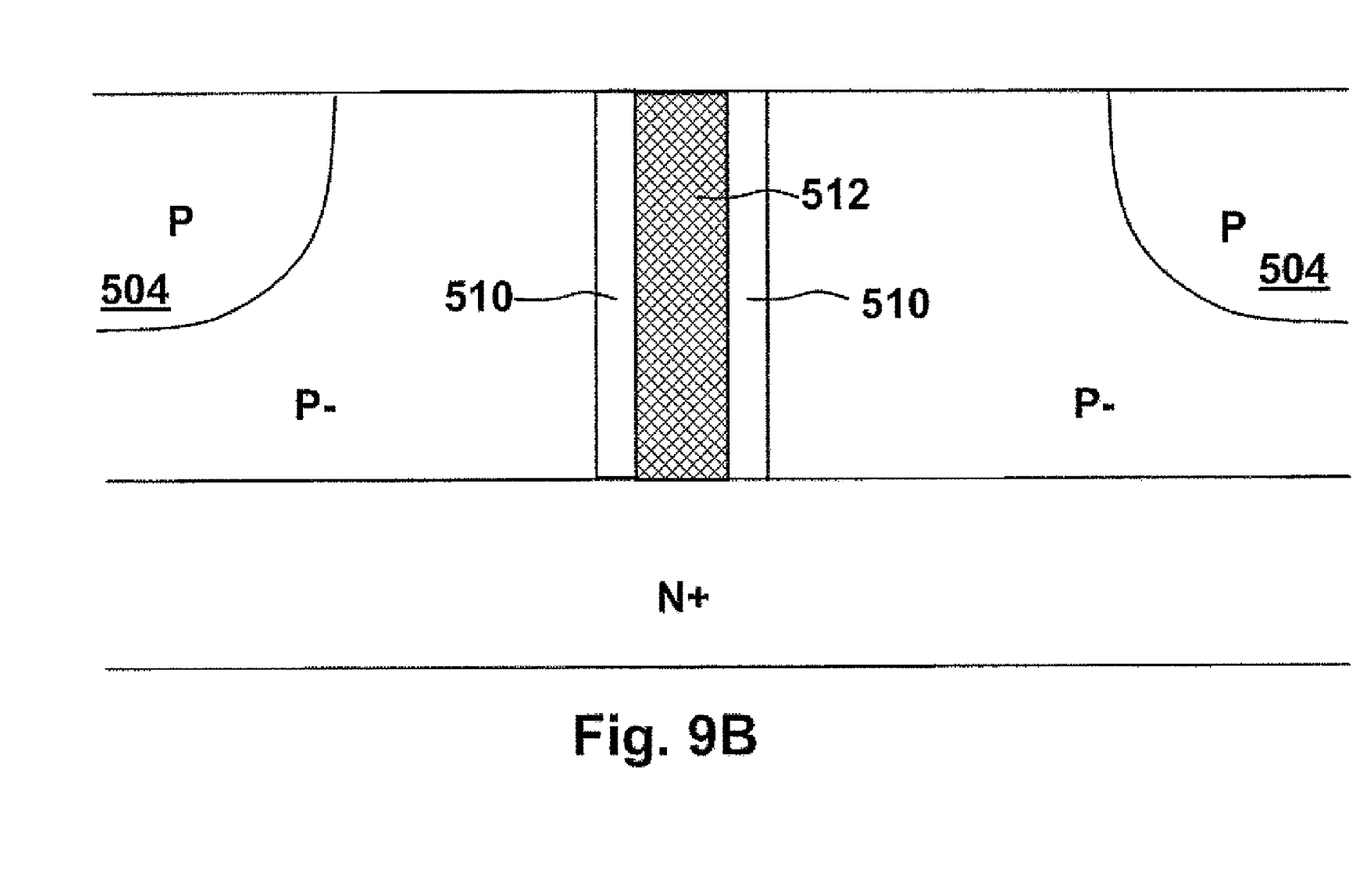
Figure 9C:
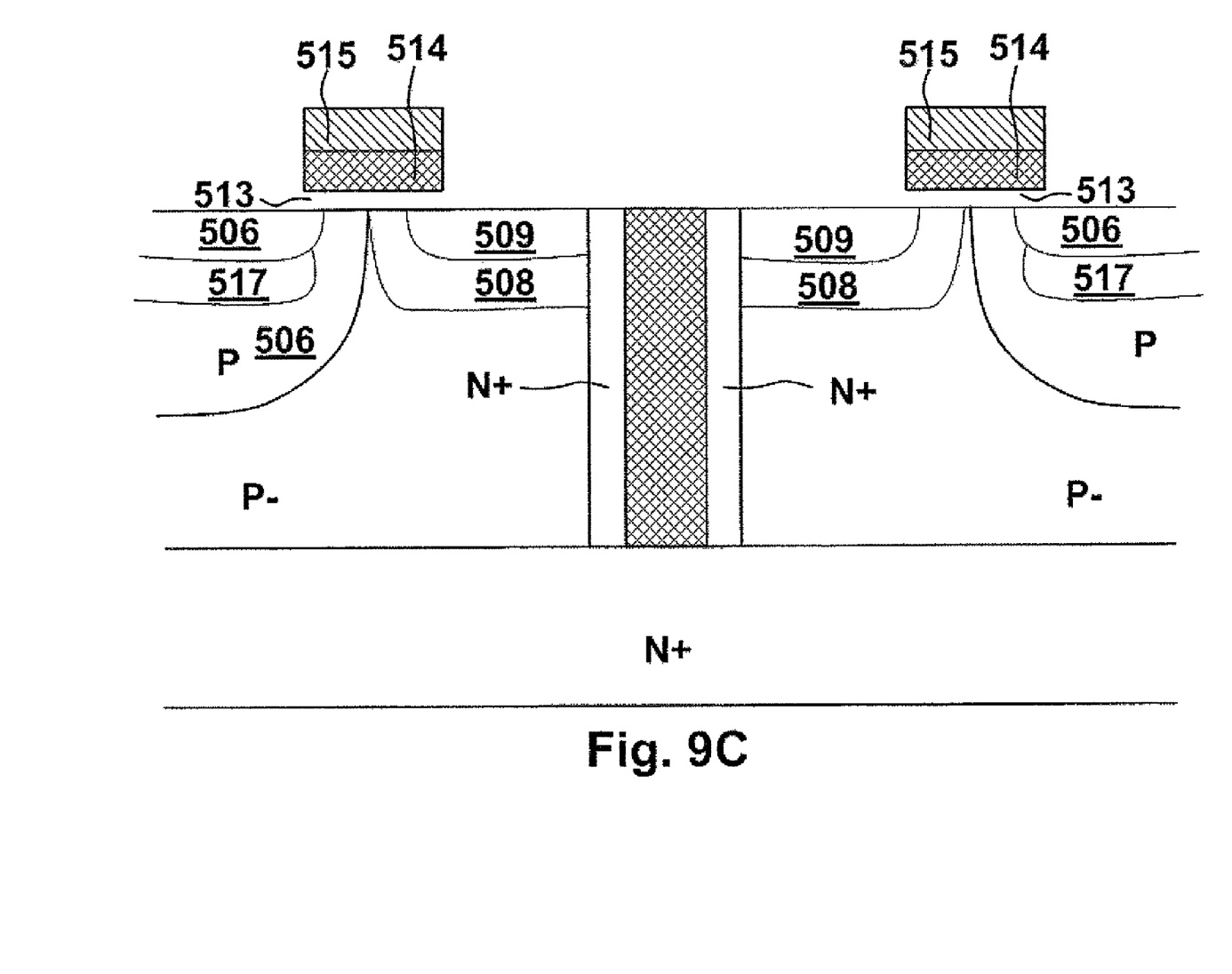
Figure 9D:
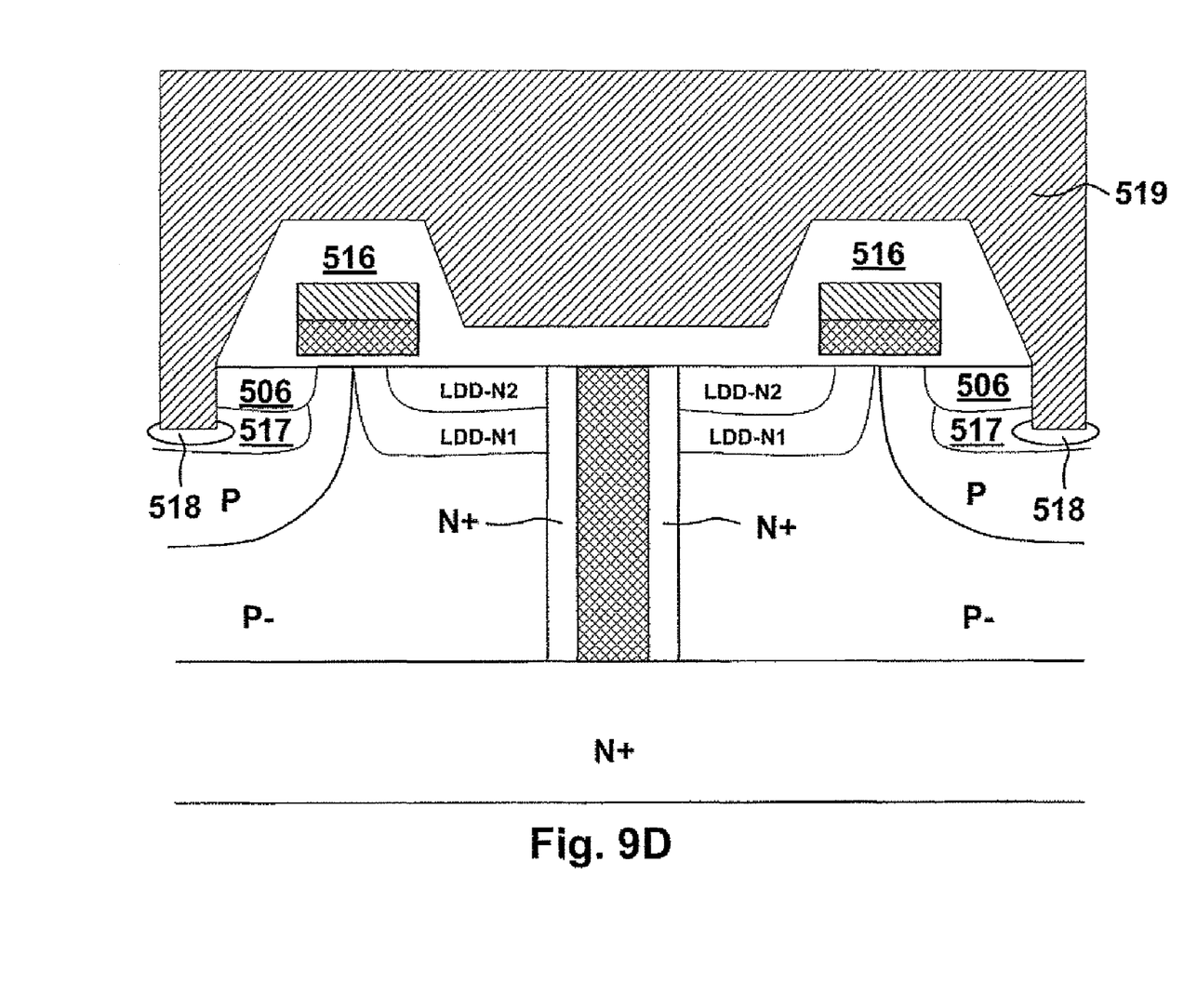

FIGS. 9A to 9D show a series of exemplary steps that are performed to form the inventive LDMOS of the present invention shown in FIG. 5. In FIG. 9A, a P− doped epitaxial layer 502 is grown on an N+ substrate 500, e.g., Arsenic doped substrate, then, a trench mask (not shown) is applied, which is then conventionally exposed and patterned to leave mask portions. The patterned mask portions define the first trench 512', which is dry silicon etched through mask to the interface between substrate and epitaxial layer. Next, a sacrificial oxide (not shown) is grown and then removed to eliminate the plasma damage may introduced during trenches etching process. After the trench mask removal, an angle As implantation is carried out above first trench 512' with ±3 degree respecting to top surface of epitaxial layer to form the N+ region 510 adjacent to said first trench, as shown in FIG. 9B. Next, doped poly, Ti/TiN/W or Co/TiN/W plug is deposited into trench 512' to form drain contact plug 512 and is then CMP (Chemical Mechanical Polishing) or etched back to expose the epitaxial layer. After that, P body implantation is carried out above P body mask (not shown) to form body region 504. Refer to FIG. 9C, a first insulating layer, doped poly and silicide layer are deposited successively onto the top surface of epitaxial layer and then etched back to form gate oxide 513 and conductivity gate 514 with silicide 515 thereon. Then, a high energy LDD Arsenic or Phosphorus implantation with 150~300 KeV and 1E11~5E11 cm$^{-2}$ dose; and low energy LDD Arsenic or phosphorus implantation with 60~100 KeV and 1E12~5E12 cm$^{-2}$ dose are successively continued to form LDD-N1 region 508 and LDD-N2 region 509 followed by a step of LDD anneal process. Next, with the same source mask (not shown), Boron implantation is applied to form P+ avalanche improved region 517, followed by Arsenic implantation for the formation of source region 506 and a step of source anneal. After that, in FIG. 9D, a second insulating layer 516 is deposited along the whole surface of device onto which formed source contact mask (not shown) for the etching of second trench by dry oxide etching through second insulating layer 516 and dry silicon etching through source region 506 and into P+ avalanche improved region 517. Above the second trench, BF2 Ion Implantation is implemented to form the P++ body contact doping region 518 around the bottom of said second trench. At last, source metal 519 is deposited filling the second trench and covering the second insulating layer 516.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fail within the true spirit and scope of the invention.

What is claimed is:

1. A method for fabricating a Laterally Diffused MOS (LDMOS) transistor formed in a P-epitaxial layer on an N+ substrate comprising:
   forming a P body region in said P-epitaxial layer, overlapped with a conductive gate padded with a gate oxide;
   forming an N+ source region encompassed in said P body region thus forming a channel region underneath said conductive gate;
   forming a drain contact trench filled with a conductive plug extending from the top surface of said P-epitaxial layer to contact with said N+ substrate and an N+ highly doped region formed along a sidewall of said contact trench;
   forming a first LDD-N1 N type doped region by ion implantation thus forming an N type drift region between said channel region and said N+ highly doped region;
   forming a second LDD-N2 N type doped region by ion implantation with a lower energy than that of said first LDD-N1 region but with a higher dose than said first LDD-N1 region wherein said second LDD-N2 region is encompassed in said first LDD-N1 region and contacts said highly doped N+ region, wherein said second LDD-N2 N type region is formed by using a same mask as said first LDD-N1 N type region.

2. The method according to claim 1, further comprising depositing an N+ doped poly-silicon as said conductive plug into said drain contact trench.

3. The method according to claim 1, further comprising depositing Ti/TiN/W or Co/TiN/W as said conductive plug into said drain contact trench.

4. The method according to claim 1, wherein said LDD-N1 region has Arsenic or Phosphorus implantation with an energy range from 150~300 KeV and dose range from 1E11~5E11 cm$^{-2}$.

5. The method according to claim 1, wherein said second LDD-N2 region has Arsenic or Phosphorus implantation with an energy range from 60~100 KeV and dose range from 1E12~5E12 cm$^{-2}$.

6. The method according to claim 1, further comprising an ion implantation with N type dopant into said channel region for threshold voltage adjustment.

7. The method according to claim 1, further comprising:
   forming a P+ avalanche improved region below said N+ source region;
   forming a source-body contact trench penetrating through said N+ source region and extending into said P body avalanche improved region; and
   forming a P++ body contact doping region wrapping around at least the bottom of said source-body contact trench.

8. The method according to claim 7, further comprising:
depositing Ti/TiN/W or Co/TiN/W into said source-body contact trench.

9. The method according to claim 7, further comprising:
forming a source metal insulated from said conductive gate and shorted to said N+ source region and said P++ body contact doping region.

10. A method for fabricating a Laterally Diffused MOS (LDMOS) transistor formed in a P-epitaxial layer on an N+ substrate comprising:
forming a P body region in said P-epitaxial layer, overlapped with a conductive gate padded with a gate oxide;
forming an N+ source region encompassed in said P body region thus forming a channel region underneath said conductive gate, wherein said channel region is ion implanted with said N type dopant for threshold voltage adjustment;
forming a drain contact trench filled with a conductive plug extending from the top surface of said P-epitaxial layer to contact with said N+ substrate and an N+ highly doped region formed along a sidewall of said contact trench;
forming a first LDD-N1 N type doped region by ion implantation thus forming an N type drift region between said channel region and said N+ highly doped region;
forming a second LDD-N2 N type doped region by ion implantation with a lower energy than that of said first LDD-N1 region but with a higher dose than said first LDD-N1 region wherein said second LDD-N2 region is encompassed in said first LDD-N1 region and contacts said highly doped N+ region.

11. The method according to claim 10, further comprising depositing an N+ doped poly-silicon as said conductive plug into said drain contact trench.

12. The method according to claim 10, further comprising depositing Ti/TiN/W or Co/TiN/W as said conductive plug into said drain contact trench.

13. The method according to claim 10, wherein said LDD-N1 region has Arsenic or Phosphorus implantation with an energy range from 150~300 KeV and dose range from 1E11~5E11 $cm^{-2}$.

14. The method according to claim 10, wherein said second LDD-N2 region has Arsenic or Phosphorus implantation with an energy range from 60~100 KeV and dose range from 1E12~5E12 $cm^{-2}$.

15. The method according to claim 10, further comprising:
forming a P+ avalanche improved region below said N+ source region;
forming a source-body contact trench penetrating through said N+ source region and extending into said P body avalanche improved region; and
forming a P++ body contact doping region wrapping around at least the bottom of said source-body contact trench.

16. The method according to claim 15, further comprising:
depositing Ti/TiN/W or Co/TiN/W into said source-body contact trench.

17. The method according to claim 15, further comprising:
forming a source metal insulated from said conductive gate and shorted to said N+ source region and said P++ body contact doping region.

* * * * *